(12) United States Patent
Kiyofuji et al.

(10) Patent No.: US 7,843,204 B2
(45) Date of Patent: Nov. 30, 2010

(54) ELECTRICAL CONNECTING APPARATUS

(75) Inventors: Hidehiro Kiyofuji, Oita (JP); Kiyotoshi Miura, Hirakawa (JP); Akihisa Akahira, Hirakawa (JP); Yoshinori Kikuchi, Hirosaki (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 49 days.

(21) Appl. No.: 12/332,242

(22) Filed: Dec. 10, 2008

(65) Prior Publication Data
US 2009/0212800 A1 Aug. 27, 2009

(30) Foreign Application Priority Data
Feb. 26, 2008 (JP) ............................. 2008-044290

(51) Int. Cl.
*G01R 31/02* (2006.01)
(52) U.S. Cl. .................... 324/754; 324/760; 324/765
(58) Field of Classification Search ............. 324/158.1, 324/755–758, 760–761, 765; 438/14–18; 451/28, 67
See application file for complete search history.

(56) References Cited
U.S. PATENT DOCUMENTS
6,941,646 B2 * 9/2005 Suhara ..................... 29/740

7,091,737 B2 * 8/2006 Norris ...................... 324/765
7,486,384 B2 * 2/2009 Tinnemans et al. ......... 355/72
7,592,821 B2 * 9/2009 Eldridge et al. ............ 324/754

FOREIGN PATENT DOCUMENTS
JP 07-098330 4/1995
WO WO2006126279 A1 11/2006

* cited by examiner

*Primary Examiner*—Minh N Tang
*Assistant Examiner*—Trung Q Nguyen
(74) *Attorney, Agent, or Firm*—Ingrassia Fisher & Lorenz, P.C.

(57) ABSTRACT

The object of the present invention is to prevent an operator from touching electronic elements arranged on an upper surface of a probe assembly of an electrical connecting apparatus at the time of carrying the electrical connecting apparatus and to restrict bowing of the probe assembly caused by the temperature difference between the upper surface and the lower surface of the probe assembly. An electrical connecting apparatus 10 comprises a probe assembly having a plurality of contactors 14 on a lower surface and a plurality of electronic elements 18 arranged on an upper surface, a cover 32 arranged on the upper surface of the probe assembly so as to close a space 30 in which the electronic elements are arranged, and two grippers 42 attached to the cover. Each gripper 42 has one end 42a and the other end 42a, has a region ranging from one end to the other end formed approximately in a U-shape, and is attached to a main body portion 33 of the cover at both the ends.

10 Claims, 9 Drawing Sheets

PRIOR ART

US 7,843,204 B2

ELECTRICAL CONNECTING APPARATUS

BACKGROUND OF THE INVENTION

The present invention relates to an electrical connecting apparatus for use in an electrical performance test or an inspection such as a power supply test of a device under test such as a semiconductor wafer having a plurality of integrated circuits.

As one of the electrical connecting apparatuses or the probe cards of this kind, there is one including a support member having an upper surface and a lower surface, a wiring board arranged on the lower surface of the support member, and a probe board arranged on the lower side of the wiring board (Patent Document 1).

Figure 9:
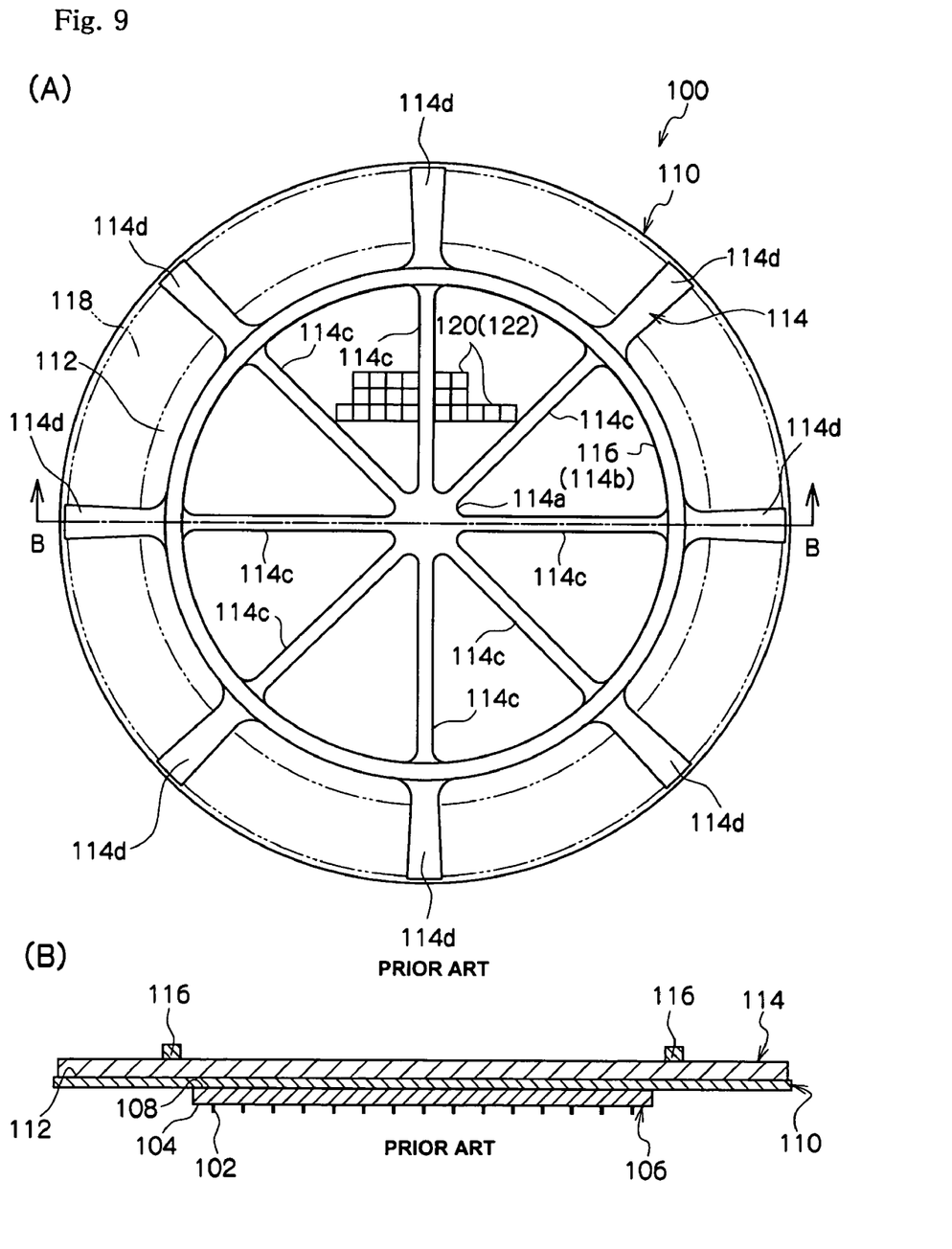
FIG. 9(A) is a plan view schematically showing a conventional electrical connecting apparatus.
FIG. 9(B) is a cross-sectional view obtained along the line B-B in FIG. 9(A).

This probe card 100 includes a circular plate-shaped probe board 106 having a plurality of contactors or probes 102 on a lower surface 104, a circular flat-plate-shaped wiring board 110 arranged on an upper surface 108 of the probe board, a support member 114 arranged on an upper surface 112 of the wiring board 110 to reinforce the wiring board 110, and an annular thermal deformation restriction member 116 arranged on the upper side of the support member as shown in FIG. 9.

The support member 114 has a circular plate-shaped center portion 114a, an annular portion 114b coaxially extending around the center portion 114a, a plurality of connection portions 114c extending outward in the radial direction from the center portion 114a and connected to the annular portion 114b, and a plurality of radial portions 114d integrally continuing to the outsides of the connection portions 114c and extending outward in the radial direction from the annular portion 114b as shown in FIG. 9(A).

The wiring board 110 has a slightly larger diameter dimension than a virtual circle joining the outer ends of the radial portions 114d of the support member 114. Also, at the annular circumferential portion of the upper surface 112 of the wiring board 110 are annularly arrayed and arranged multiple connectors 118 to be connected to electrical circuits of a tester (not shown) as shown in FIG. 9(A). Each connector 118 has a plurality of terminals (not shown).

At the center region on the lower surface of the wiring board 110 are arranged multiple electrical connecting terminals (not shown) corresponding to the respective terminals of the connectors 118. As shown in FIG. 9(A), at the center region on the upper surface 112 of the wiring board 110 are arranged multiple electronic elements 122, such as multiple relays switching the electrical connecting terminals to be connected to the terminals of the connectors 118 depending on the test contents or interrupting wiring circuits (not shown) of the wiring board 110 in an emergency, capacitors for charge or alternating-current erasure, and so on, depending on the type of the power supply test.

Recently, there is a demand for an electrical connecting apparatus or a probe card that enables a simultaneous test of multiple integrated circuits on a semiconductor wafer, along with which more and more electronic elements have been arranged on the wiring board. Accordingly, the wiring board has increased its size and weight.

Under such circumstances, an operator performing a replacement operation of the probe cards grips the support member of the probe card and carries the probe card to a desired location.

However, since the operator is required to firmly hold the large-sized and weighted probe card so as not to drop it at the time of carrying it, there has been a problem in which the operator touches the electronic elements on the wiring board by mistake and breaks the electronic elements themselves or a problem of disconnection of the wires of the electronic elements.

Also, the aforementioned probe card causes the following problem at the time of a power supply test.

At the time of the power supply test, the temperature of a stage on which a semiconductor wafer as a device under test is mounted is controlled in accordance with the integrated circuits formed on the semiconductor wafer. However, the semiconductor wafer is heated by the temperature of the stage, and the lower surface of the probe card is heated by the radiant heat of the heated semiconductor wafer. Accordingly, there has been a problem in which the temperature difference occurs between the upper surface and the lower surface of the probe card, in which the probe card is bowed downward in a protruded form, and in which the positions and the heights of the contactors vary.

To cope with the above problem, there is proposed a technique (e.g., Patent Document 2) of making the support member as a reinforcing plate with use of stainless steel (SUS) having a lower thermal expansion coefficient than that of the wiring board to restrict the bowing of the wiring board by this support member. However, this cannot restrict the bowing of the wiring board caused by the temperature difference sufficiently.

Patent Document 1: WO 2006-126279A1
Patent Document 2: Japanese Patent No. 3096197

BRIEF SUMMARY OF THE INVENTION

It is an object of the present invention to prevent an operator from touching electronic elements arranged on an upper surface of a probe assembly of an electrical connecting apparatus at the time of carrying the electrical connecting apparatus and to restrict bowing of the probe assembly caused by the temperature difference between the upper surface and the lower surface of the probe assembly.

An electrical connecting apparatus according to the present invention comprises a probe assembly having an upper surface and a lower surface and having a plurality of contactors on the lower surface and a plurality of electronic elements on the upper surface, and a cover arranged on the upper surface of the probe assembly so as to close a space in which the electronic elements are arranged.

The electrical connecting apparatus according to the present invention may further comprise at least one gripper attached to the cover.

The cover may have a circular plate-shaped main body portion located on the upper side of the space, and the gripper may have one end and the other end, have a region ranging from one end to the other end formed approximately in a U shape, and be attached to the main body portion of the cover at both the ends angularly rotatably around an axis parallel to the main body portion of the cover.

The cover may further have an attachment attaching each end of the gripper to the main body portion angularly rotatably around the axis, and the main body portion of the cover may have a cut-out portion housing at least part of the gripper when the gripper is angularly rotated around the axis to be approximately horizontal.

The attachment may have a spring arranged between the main body portion and the gripper and biasing the gripper so that at least part of the gripper is housed in the cut-out portion.

The attachment may further have a stopper restricting the maximum value of an angle by which the gripper can be angularly rotated from a position of the gripper at which at least part of the gripper is housed in the cut-out portion in a direction in which the gripper stands up.

The probe assembly may include a probe board having the plurality of contactors on a lower surface thereof, a wiring board attached to an upper surface of the probe board and having the electronic elements on an upper surface of the wiring board, and a support member arranged on the wiring board. Also, the support member may have a circular plate-shaped center portion, an annular portion coaxially extending around the center portion, and a plurality of connection portions extending outward in the radial direction from the center portion and connected to the annular portion, the cover may be arranged on the support member, and the plurality of electronic elements may be within an inner region of the annular portion and be arranged on the wiring board.

The probe assembly may include a probe board having the plurality of contactors on a lower surface thereof, a wiring board attached to an upper surface of the probe board and having the electronic elements on an upper surface of the wiring board, a support member arranged on the wiring board, and a thermal deformation restriction member arranged on the support member. Also, the support member may have a circular plate-shaped center portion, an annular portion coaxially extending around the center portion, and a plurality of connection portions extending outward in the radial direction from the center portion and connected to the annular portion, the cover may be arranged on the thermal deformation restriction member, and the plurality of electronic elements may be within an inner region of the annular portion and be arranged on the wiring board.

The cover may have a circular plate-shaped main body portion located on the upper side of the space, and the main body portion may have at least one through hole communicating with the space and a space on the upper side of the cover. The cover may further have an opening/closing means performing opening/closing of the through hole.

According to the present invention, since the electronic elements arranged on the upper surface of the probe assembly are protected by the cover, an operator is prevented from touching the electronic elements.

Also, according to the present invention, since heat from a stage located on the lower side of the probe assembly for the purpose of receiving a device under test is accumulated in a space closed by the cover at the upper surface side of the probe assembly, the temperature on the upper surface side of the probe assembly is kept approximately at the temperature on the lower surface side of the probe assembly, and the temperature difference between the upper surface and the lower surface of the probe assembly is reduced. As a result, generation of thermal deformation or bowing of the probe assembly caused by the temperature difference between the upper and lower surfaces is restricted, and variation of the height positions of the tip ends of the contactors arranged on the lower surface of the probe assembly is restricted.

In a case where the electrical connecting apparatus includes the gripper attached to the cover, it is possible to carry the electrical connecting apparatus with use of the gripper, which makes it easy to carry the electrical connecting apparatus.

Attaching both the ends of the gripper to the main body portion of the cover angularly rotatably can contribute to easy carriage of the electrical connecting apparatus.

In a case where the main body portion of the cover has the cut-out portion housing at least part of the gripper, the electrical connecting apparatus can be attached/detached to/from a tester in a state where at least part of the gripper is received in the cut-out portion. Accordingly, an attachment/detachment operation of the electrical connecting apparatus to/from the tester becomes easy.

In a case where the attachment has the spring biasing the gripper so as to house the gripper in the cut-out portion, the gripper is automatically housed in the cut-out portion when the operator gets his/her hand off from the gripper, which can omit the operator's operation of housing the gripper in the cut-out portion. Also, at the time of attachment/detachment of the electrical connecting apparatus to/from the tester, since part of the gripper is received in the cut-out portion by the spring, the operator can attach/detach the electrical connecting apparatus to/from the tester without laying down the gripper by hand. Accordingly, the attachment/detachment operation of the electrical connecting apparatus to/from the tester becomes easy.

In a case where the electrical connecting apparatus is carried in a state where the gripper abuts on the stopper to stop rotation of the gripper by the stopper, the electrical connecting apparatus can be carried in a stable state without wobbling. Further, in a case where the maximum angularly rotatable angle of the gripper is set to be 90 degrees or less from the cut-out portion in which the gripper is housed, the gripper is automatically housed in the cut-out portion by its own weight, which can omit the operator's operation of housing the gripper in the cut-out portion.

In a case where the main body portion of the cover has the through hole, heat emitted to the space through the probe assembly can be let out of the space. Accordingly, the upper surface of the probe assembly can be prevented from being heated excessively.

Also, in a case where the cover includes the opening/closing means performing opening/closing of the through hole, the amount of heat to be let out of the space can be adjusted by opening/closing of the through hole. Accordingly, the temperature of the upper surface of the probe assembly can be adjusted.

DETAILED DESCRIPTION OF THE INVENTION

Hereinafter, preferred embodiments of the present invention will be explained with reference to the drawings.

About Terms

Figure 2:
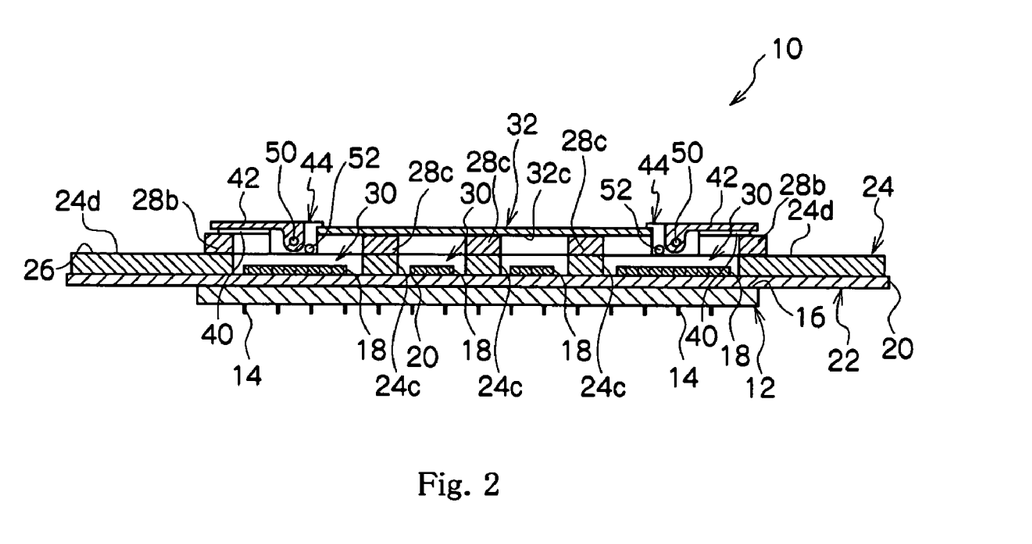
FIG. 2 is a cross-sectional view obtained along the line 2-2 in FIG. 1.

In the present invention, the up-down direction is an up-down direction in which the cover side is upper, and in which the contactors side is lower in FIG. 2, and the right-left direction is a right-left direction in which grippers are distanced in FIG. 2. However, these directions differ depending on the posture of a semiconductor wafer as a device under test at the time of arranging the semiconductor wafer to a tester to which a probe card is attached.

Hereinafter, a first embodiment of an electrical connecting apparatus or a probe card according to the present invention will be described with reference to FIGS. 1 to 6.

Figure 1:
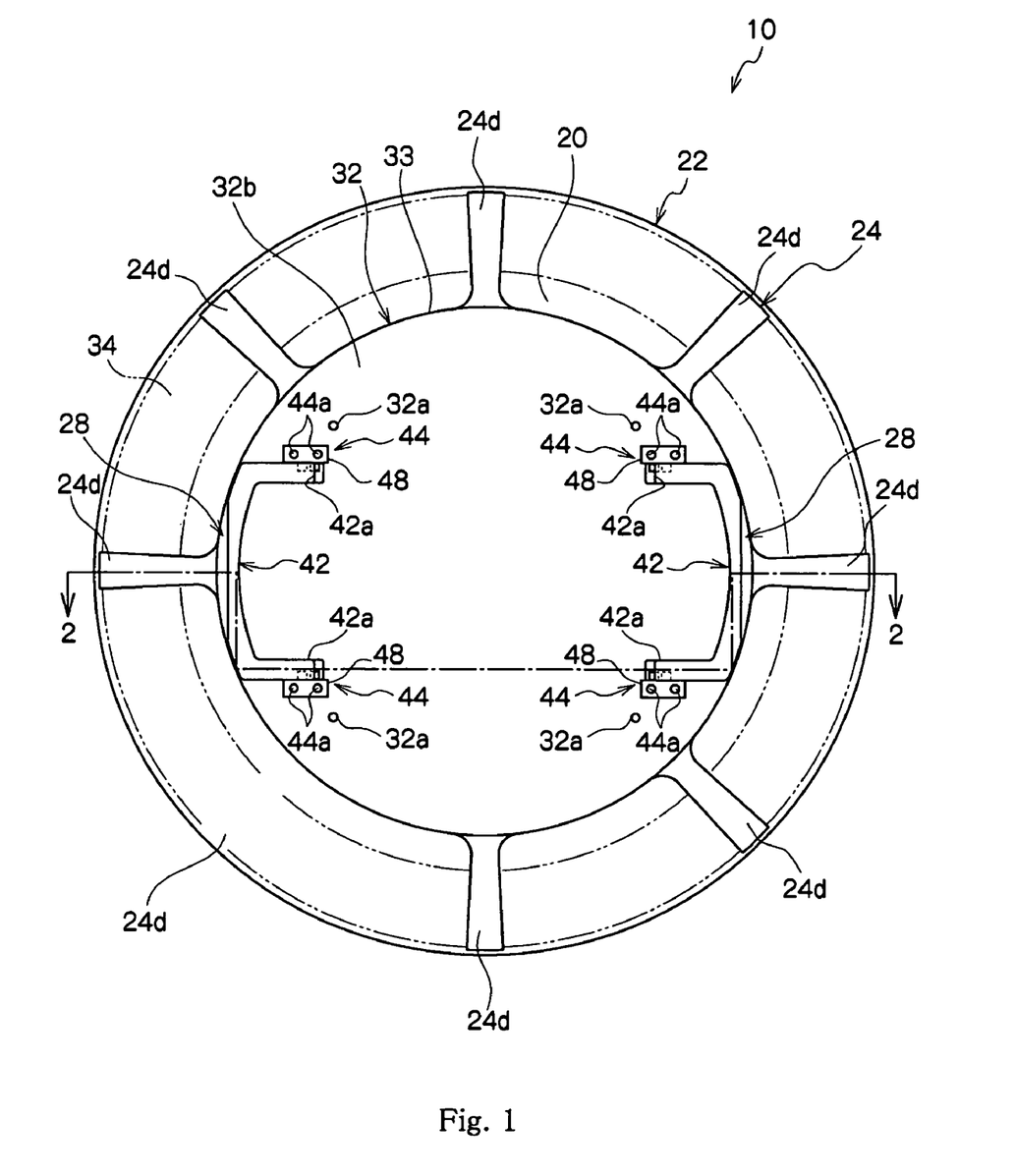
FIG. 1 is a plan view schematically showing a first embodiment of an electrical connecting apparatus according to the present invention.
Figure 3:
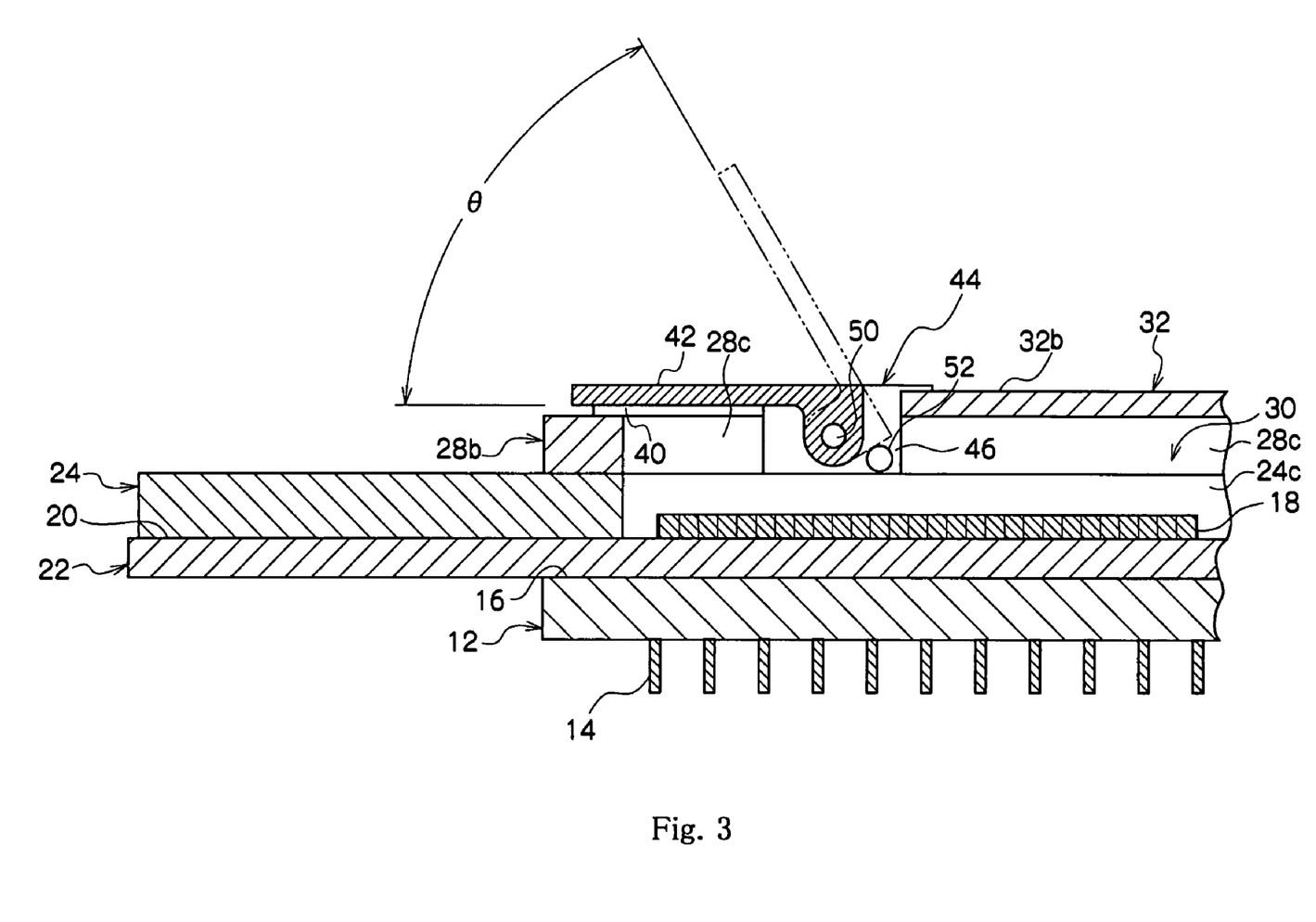
FIG. 3 is a partially enlarged cross-sectional view of FIG. 2.
Figure 4:
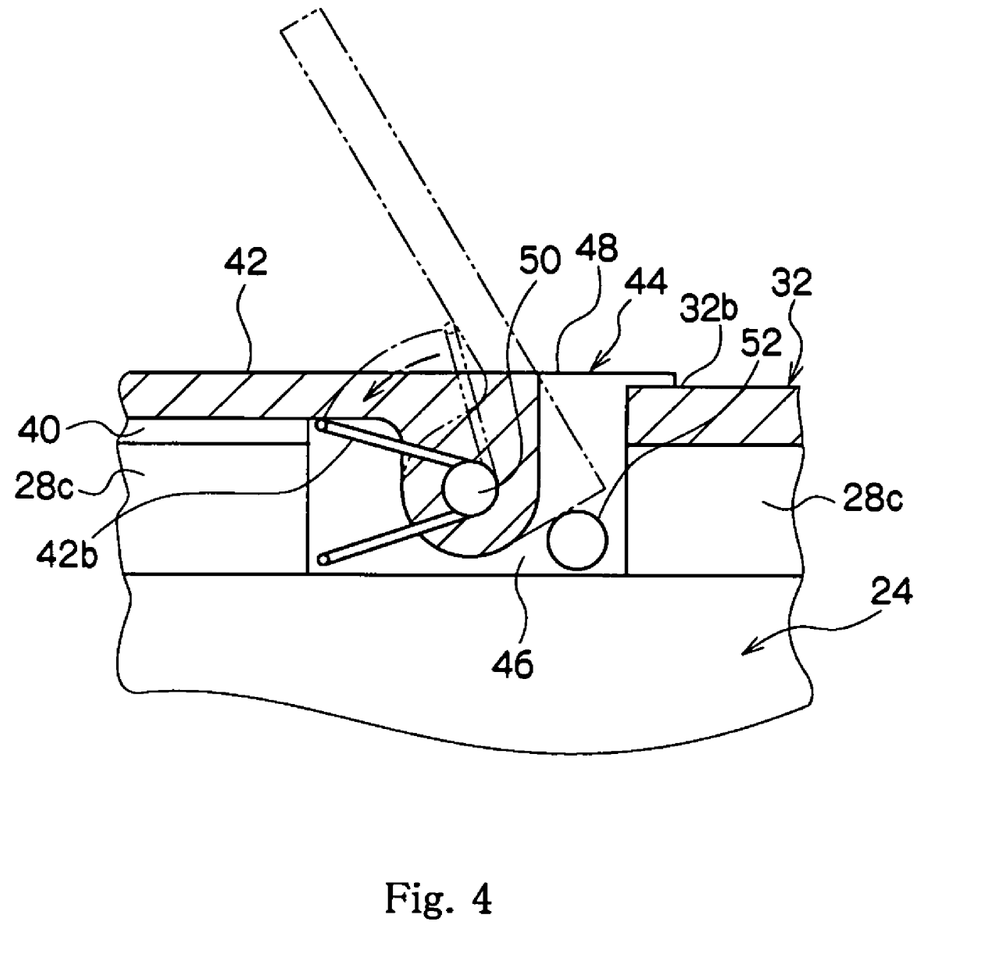
FIG. 4 is an enlarged schematic view showing a state where a torsion spring is attached to the gripper in FIG. 3 and its attachment.

A probe card 10 includes a probe assembly. As shown in FIGS. 1 to 3, the probe assembly comprises a circular flat-plate-shaped probe board 12 having a plurality of contactors 14 on a lower surface 12, a wiring board 22 arranged on an upper surface 16 of the probe board 12 and having a plurality of electronic elements 18 on an upper surface 20, a support member 24 arranged on the wiring board 22, a thermal deformation restriction member 28 arranged on an upper surface 26 of the support member 24 to restrict thermal deformation of the support member 24, and a cover 32 arranged on an upper surface of the thermal deformation restriction member 28 and closing spaces 30 in which the electronic elements 18 are arranged.

The probe board 12 and the wiring board 22 are attached to each other by bolts or the like (not shown). Similarly, the wiring board 22 and the support member 24 are attached to each other by bolts or the like (not shown). Also, the support member 24 and the thermal deformation restriction member 28 are attached to each other by bolts or the like (not shown).

The support member 24 has a circular plate-shaped center portion 24a, an annular portion 24b coaxially extending around the center portion 24a, a plurality of (eight in the example shown in the figures) connection portions 24c extending outward in the radial direction from the center portion 24a and connected to the annular portion 24b, and a plurality of (eight in the example shown in the figures) radial portions 24d integrally continuing to the outsides of these connection portions 24c and extending outward in the radial direction from the annular portion 24b.

Figure 6:
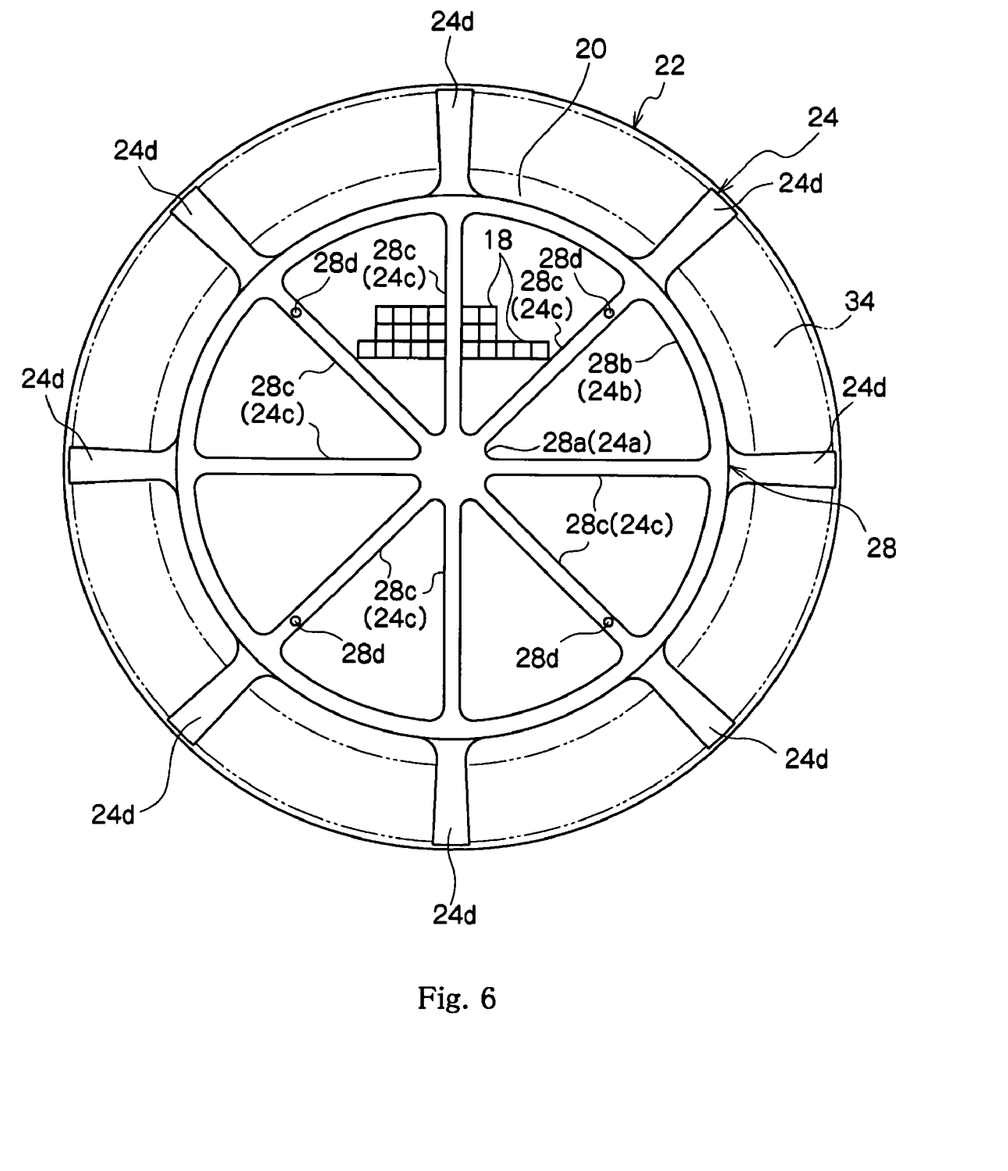
FIG. 6 is a plan view showing the electrical connecting apparatus in FIG. 1 in a state where the cover in FIG. 3 is removed.

The thermal deformation restriction member 28 has a center portion 28a, an annular portion 28b, and connection portions 28c respectively corresponding to the center portion 24a, the annular portion 24b, and the connection portions 24c of the support member 24 as shown in FIG. 6.

Each of the four connection portions 28c out of the plurality of connection portions 28c has a screw hole 28d. Each screw hole 28d corresponds to a through hole 32a provided at a circular plate-shaped main body portion 33 of the cover 32 so as to penetrate the main body portion in its thickness direction.

The cover 32 is screwed shut on the connection portions 28c by a plurality of screw members (not shown) that pass through the through holes 32a of the main body portion 33 from the upper side and whose tip ends are screwed in the screw holes 28d.

The wiring board 22 has a slightly larger diameter dimension than a virtual circle joining the outer ends of the radial portions 24d of the support member 24. At the annular circumferential portion of the upper surface 20 of the wiring board 22 are annularly arrayed and arranged multiple connectors 34 to be connected to electrical circuits of a tester as shown in FIG. 1. Each connector 34 has a plurality of terminals (not shown).

At the center region on the lower surface of the wiring board 22 are arranged multiple electrical connecting terminals (not shown) corresponding to the respective terminals of the connectors. As shown in FIG. 6, electronic elements 18 are removably attached to regions surrounded by the annular portion 24b and the connection portions 24c of the support member 24 located at the center region on the upper surface 20 of the wiring board 22.

The respective electronic elements 18 are multiple relays switching the electrical connecting terminals to be connected to the terminals of the connectors depending on the test contents or interrupting wiring circuits (not shown) of the wiring board 22 in an emergency, capacitors for charge or alternating-current erasure, and so on.

Figure 5:
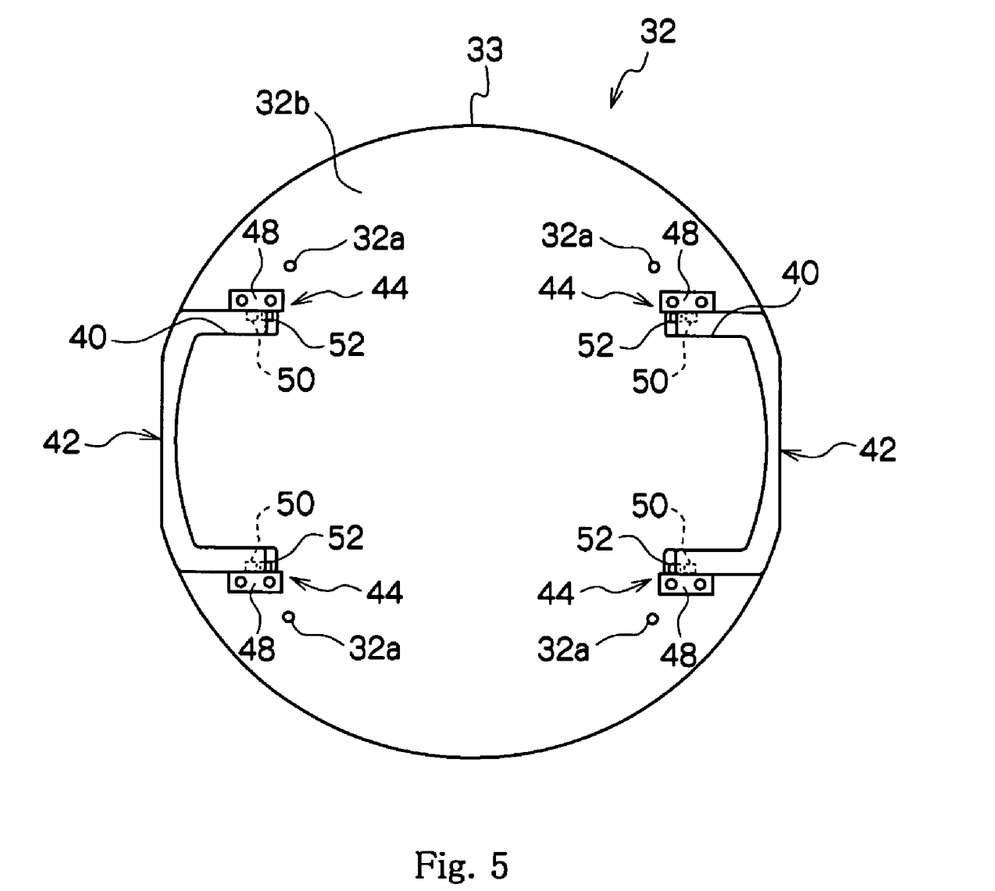
FIG. 5 is an enlarged plan view of a cover used in the electrical connecting apparatus in FIG. 1.

The cover 32 is made of aluminum (A5052) or stainless steel (SUS410). The cover 32 has a pair of U-shaped cut-out portions 40 to be spaced in the right-left direction as shown in FIG. 5.

To the cover 32 is attached each gripper 42 housed in each cut-out portion 40 at at least its part by a pair of attachments 44 spaced in a direction of an axis extending parallel to the main body portion 33 and a plurality of screw members 44a (FIG. 1) attaching each attachment 44 to the cover 32.

Each gripper 42 has both end portions 42a and is formed in a U shape approximately corresponding to the shape of the cut-out portion 40 over the entire region ranging from one end 42a to the other end 42a. Each gripper 42 is attached to the cover 32 by the attachments 44 at its both ends angularly rotatably around a virtual axis extending parallel to the main body portion 33 of the cover 32.

Each attachment 44 has a thin-plate-shaped main body portion 46 and a bent portion 48 continuing to the upper portion of the main body portion 46 and bent to a side opposite a side of the corresponding other attachment 44. Each main body portion 46 comprises a first protrusion 50 approximately at its center and a second protrusion 52 in the vicinity of the lower end portion.

The first protrusion 50 of each attachment 44 for each gripper 42 is located on a common virtual axis parallel to the main body portion 33 of the cover 32. Similarly, the second protrusion 52 of each attachment 44 for each gripper 42 is located on another common virtual axis parallel to the main body portion 33.

Both the first protrusions 50 of the respective attachments 44 are attached to the corresponding end portions 42a of the gripper 42 so that the gripper 42 can be rotated from a state where its part is housed in the cut-out portion 40 to a standing state with both the first protrusions 50 being a rotation axis. Both the second protrusions 52 of the respective attachments 44 collectively play a role of stoppers restricting the maximum rotation angle θ of the gripper 42 to be 90 degrees or less, preferably 50 to 70 degrees or so, and more preferably 60 degrees.

At the time of replacement of the probe card 10, an operator lets the grippers 42 housed in the respective cut-out portions 40 stand up from the cut-out portions 40 and grips both the grippers 42 by hands to be able to carry the probe card 10. At this time, since the electronic elements 18 arranged in the spaces 30 are protected by the cover 32, the operator is prevented from touching the electronic elements, which leads to easy handling of the probe card 10.

When the gripper 42 is made to stand up from a state of being housed in the cut-out portion 40, the maximum rotation angle θ of the gripper 42 is restricted to be 90 degrees or less, preferably 50 to 70 degrees or so, and more preferably 60 degrees by the stoppers or the second protrusions 52. Accordingly, since the gripper 42 is prevented from standing upright against the main body portion 33 of the cover 32, the gripper 42 returns to a state where its part is housed in the cut-out portion 40 by its own weight when the operator gets his/her hand off from the gripper 42.

However, a spring, e.g., a torsion spring 42b, may be attached between the gripper 42 and the attachment 44 (FIG. 4) to bias the gripper 42 by the spring 42b so that the gripper 42 is housed in the cut-out portion 40. By doing so, when the operator gets off his/her hand from the gripper 42, the gripper 42 is laid down by the spring 42b to such a state as its part is housed in the cut-out portion 40. Thus, no operation for the operator to house the gripper 42 in the cut-out portion 40 is needed, which facilitates an attachment/detachment operation of the probe card 10 to/from the tester. When the torsion spring 42b is provided, the maximum rotation angle θ by the second protrusion 52 is not limited to 90 degrees or less.

When the part of the gripper 42 is housed in the cut-out portion 40, the gripper 42 projects slightly upward from the upper surface 32b of the cover 32 as shown in FIG. 3. However, in such a state, the upper surface of the gripper 42 is located on the same plane as the upper surface of the bent portion 48 (FIG. 1) of the attachment 44.

Thus, since the gripper 42 is mostly housed in the cut-out portion 40, the probe card 10 can be attached and detached to and from the tester in such a state, which facilitates the attachment/detachment operation of the probe card 10 to/from the tester.

With the probe card 10, since the electronic elements 18 on the upper surface of the probe assembly are protected by the cover 32 at the time of the attachment/detachment operation of the probe card 10 to/from the tester, the operator is prevented from touching the electronic elements 18.

At the time of an electrical test with use of the probe card 10, the stage of the tester (not shown) is heated so as to keep a device under test received on the stage at a high temperature. Accordingly, the probe assembly is also heated by the heat from the stage and the device under test, and its temperature rises.

Heat generation sources are thought to be not only the heated stage and the device under test heated by the heat from the stage at the time of the electrical test but also heat generation of the electronic elements 18, the contactors 14, the wires (not shown) of the wiring board 22, and so on.

However, in the probe card 10, since the spaces 30 in which the electronic elements 18 are arranged are closed by the cover 32, heat is accumulated in the spaces 30. Consequently, the upper surface of the probe assembly is kept at approximately the same temperature as the temperature on the lower surface side of the probe assembly, and the temperature difference between the upper surface side and the lower surface side of the probe assembly is reduced.

As a result, generation of thermal deformation or bowing of the probe assembly (especially, the wiring board 22) caused by the temperature difference between the upper and lower surfaces is restricted, and variation of the height positions of the tip ends of the contactors arranged on the lower surface of the probe assembly is restricted.

A second embodiment of the electrical connecting apparatus (probe card) according to the present invention will be described with reference to FIG. 7.

Figure 7:
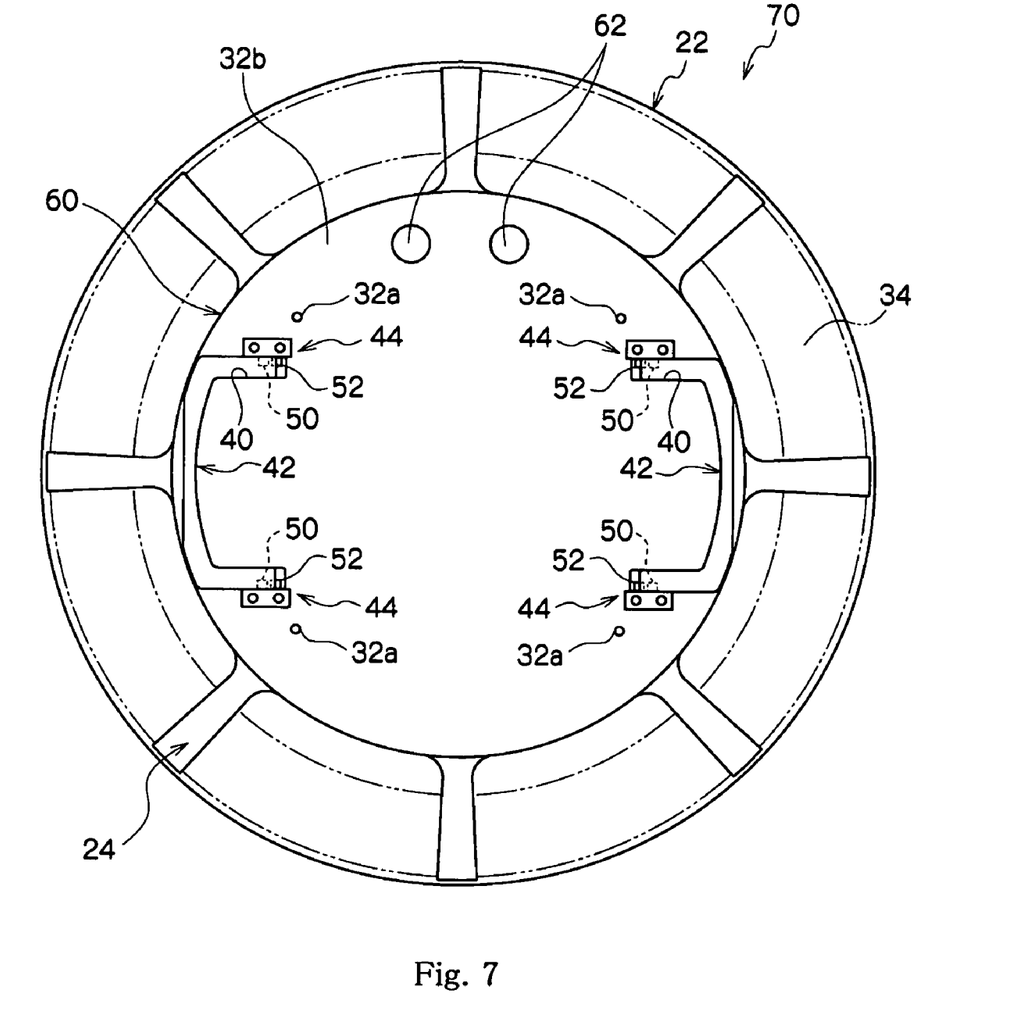
FIG. 7 is a plan view schematically showing a second embodiment of an electrical connecting apparatus according to the present invention.

As shown in FIG. 7, a cover 60 differs from the cover 32 in FIG. 1 and comprises two circular through holes 62 in the vicinity of the circumferential portion of the main body portion 33. Since the configuration other than the through holes 62 is the same as the configuration of the probe card 10 in FIG. 1, the components constituting the configuration are shown with the same reference numbers, and their explanation is omitted.

The through holes 62 penetrate the main body portion 33 in the thickness direction and let the upper space of the cover 60 communicate with the lower space of the cover 60, that is, a lower surface 32c (FIG. 2) of the cover 60, the upper surface 20 of the wiring board 22, and the spaces 30 defined by the support member 28. These through holes 62 can contribute to letting out heat accumulated in the spaces 30 to the upper space of the cover 60.

Operation of the relays and so on and readout of the format numbers of the integrated circuits and so on in relation to the electronic elements 18 arranged on the upper surface 20 of the wiring board 22 can be done through the through holes 62. Thus, the positions, shapes, number, and sizes of the through holes 62 can be determined in accordance with the specification of the probe card, e.g., the size and shape of the probe card, the positions and sizes of the electronic elements, and so on.

Other Embodiment of the Cover

Figure 8:
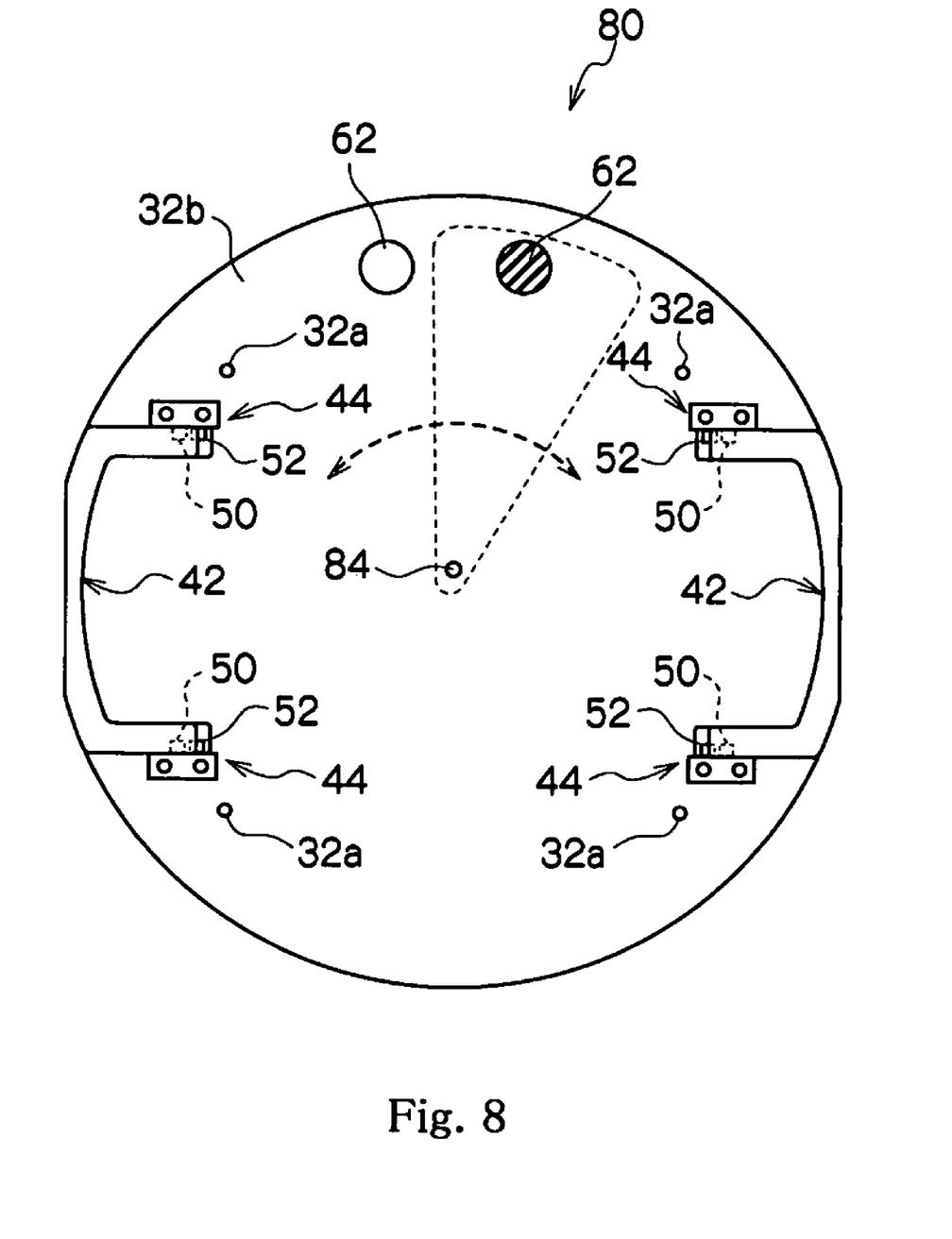
FIG. 8 is a plan view of a different cover from the cover in FIG. 7.

As shown in FIG. 8, a cover 80 differs from the cover 60 in FIG. 7 and comprises a plate 82 that opens and closes the two through holes 62. Since the configuration other than with respect to comprising the plate 82 is the same as the configuration of the cover 60 in FIG. 7, the components constituting the configuration are shown with the same reference numbers, and their explanation is omitted.

The plate 82 is made of a fan-like metal flat plate having the size and shape sufficient to close at least the two through holes 62 at the same time. The plate 82 can rotate around an axis 84 provided approximately at the center portion on the lower surface (back surface) of the main body portion 33 of the cover 80 in a direction of the dotted arrow shown in the figure.

In the example shown in the figure, the plate 82 is attached to the main body portion 33 by the axis 84 at the proximity of the peak of the fan and closes one through hole 62 (shown by the hatching).

Angularly rotating the plate 82 around the axis 84 can close one or both through holes 62 and change or increase/decrease the aperture (opening) area of one through holes 62. In this manner, the amount of heat to be let out to the upper space of the cover 80 can be adjusted. The maximum aperture area is the sum of the aperture areas of both the through holes 62.

In the above embodiments, a cover comprising at the outer circumferential portion on the lower surface of the main body portion 33 protruded portions annularly arranged continuously or intermittently may be used instead of the aforementioned cover 32.

In the above embodiments, a thermal deformation restriction member having a protruded portion annularly arranged continuously, that is, a thermal deformation restriction member not having the center portion 28a nor the connection portions 28c but having the annular portion 28b, may be used instead of the aforementioned thermal deformation restriction member 28. In such a case, the cover 32 can be screwed shut on the annular portion 28b at its main body portion 33.

In the present invention, since heat is accumulated in the spaces 30 in which the electronic elements 18 are arranged, and the temperature difference between the upper surface side and the lower surface side of the probe assembly is reduced, the thermal deformation restriction member 28 may not be provided. In such a case, the cover 32 is screwed shut on the annular portion 24b of the support member 24 at its main body portion 33.

The present invention is not limited to the above embodiments but may be altered in various ways without departing from the spirit and scope of the present invention.

What is claimed is:

1. An electrical connecting apparatus comprising:
a probe assembly having an upper surface and a lower surface and having a plurality of contactors on said lower surface and a plurality of electronic elements on said upper surface;
a cover arranged on said upper surface of said probe assembly so as to close a space in which said electronic elements are arranged; and
at least one gripper configured to accommodate carrying of the electrical connecting apparatus, said at least one gripper being rotatably attached to said cover, wherein said cover has a circular plate-shaped main body portion located on the upper side of said space, and said gripper is attached to said main body portion of said cover angularly rotatably around an axis parallel to said main body portion of said cover.

2. The electrical connecting apparatus according to claim 1, wherein said gripper has a first end and a second end, has a region ranging from said first end to said second end formed approximately in a U-shape, and is attached to said main body portion of said cover at both said ends.

3. The electrical connecting apparatus according to claim 2, wherein said cover further has an attachment attaching each end of said gripper to said main body portion angularly rotatably around said axis, and said main body portion of said cover has a cut-out portion housing at least part of said gripper when said gripper is angularly rotated around said axis to be approximately horizontal.

4. The electrical connecting apparatus according to claim 3, wherein said attachment has a spring arranged between said main body portion and said gripper and biasing said gripper so that at least part of said gripper may be housed in said cut-out portion.

5. The electrical connecting apparatus according to claim 4, wherein said attachment further has a stopper restricting the maximum value of an angle by which said gripper can be angularly rotated from a position of said gripper at which said at least part of said gripper is housed in said cut-out portion in a direction in which said gripper stands up.

6. The electrical connecting apparatus according to claim 1, wherein said probe assembly includes a probe board having said plurality of contactors on a lower surface thereof, a wiring board attached to an upper surface of said probe board and having said electronic elements on an upper surface of said wiring board, and a support member arranged on said wiring board, said support member has a circular plate-shaped center portion, an annular portion coaxially extending around said center portion, and a plurality of connection portions extending outward in the radial direction from said center portion and connected to said annular portion, said cover is arranged on said support member, and said plurality of electronic elements are within an inner region of said annular portion and are arranged on said wiring board.

7. The electrical connecting apparatus according to claim 1, wherein said probe assembly includes a probe board having said plurality of contactors on a lower surface thereof, a wiring board attached to an upper surface of said probe board and having said electronic elements on an upper surface of said wiring board, a support member arranged on said wiring board, and a thermal deformation restriction member arranged on said support member, said support member has a circular plate-shaped center portion, an annular portion coaxially extending around said center portion, and a plurality of connection portions extending outward in the radial direction from said center portion and connected to said annular portion, said cover is arranged on said thermal deformation restriction member, and said plurality of electronic elements are within an inner region of said annular portion and are arranged on said wiring board.

8. The electrical connecting apparatus according to claim 1, wherein said cover has a circular plate-shaped main body portion located on the upper side of said space, and said main body portion has at least one through hole communicating with said space and a space on the upper side of said cover.

9. The electrical connecting apparatus according to claim 8, wherein said cover further has an opening/closing means performing opening/closing of said through hole.

10. An electrical connecting apparatus comprising:
a probe assembly having an upper surface and a lower surface and having a plurality of contactors on said lower surface and a plurality of electronic elements on said upper surface;
a cover arranged on said upper surface of said probe assembly so as to close a space in which said electronic elements are arranged; and
at least one gripper attached to said cover;
wherein said cover has a circular plate-shaped main body portion located on the upper side of said space; and
wherein said gripper has a first end and a second end, has a region ranging from said first end to said second end formed approximately in a U-shape, and is attached to said main body portion of said cover at both of said ends angularly rotatably around an axis parallel to said main body portion of said cover.

* * * * *